(12) United States Patent
Gutman et al.

(10) Patent No.: US 10,622,238 B2
(45) Date of Patent: Apr. 14, 2020

(54) OVERLAY MEASUREMENT USING PHASE AND AMPLITUDE MODELING

(71) Applicant: KLA-TENCOR CORPORATION, Milpitas, CA (US)

(72) Inventors: Nadav Gutman, Zichron Ya'aqov (IL); Moran Zaberchik, Ahuzat Barak (IL); Eran Amit, Haifa (IL)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/068,462

(22) PCT Filed: Jun. 7, 2018

(86) PCT No.: PCT/US2018/036362
§ 371 (c)(1),
(2) Date: Jul. 6, 2018

(87) PCT Pub. No.: WO2019/236084
PCT Pub. Date: Dec. 12, 2019

(65) Prior Publication Data
US 2019/0378737 A1    Dec. 12, 2019

(51) Int. Cl.
*H01L 21/68* (2006.01)
*G06T 1/00* (2006.01)
(Continued)

(52) U.S. Cl.
CPC .......... *H01L 21/681* (2013.01); *G01B 11/272* (2013.01); *G06T 1/0014* (2013.01); *G06T 7/0004* (2013.01); *G06T 2207/30148* (2013.01)

(58) Field of Classification Search
None
See application file for complete search history.

(56) References Cited

U.S. PATENT DOCUMENTS

| 7,684,039 B2 | 3/2010 | Adel et al. |
| 8,330,281 B2 | 12/2012 | Ghinovker et al. |

(Continued)

FOREIGN PATENT DOCUMENTS

WO    2019010325 A1    1/2019

OTHER PUBLICATIONS

ISA/KR, International Search Report for PCT/US2018/036362 dated Feb. 26, 2019.

*Primary Examiner* — Shawn Decenzo
(74) *Attorney, Agent, or Firm* — Hodgson Russ LLP

(57) ABSTRACT

Methods and systems are disclosed for determining overlay in a semiconductor manufacturing process. Radiation reflected from a diffraction pattern in a metrology target may include +1 and −1 diffraction patterns at different wavelengths and focal positions. The different wavelengths of radiation may be in a waveband where the sensitivity of contrast to wavelength is at a maximum. The reflected radiation may be analysed to obtain measured values of overlay as well as amplitude and/or phase corresponding to points distributed over the target, for different wavelengths and focal positions. The measured values of overlay may undergo a series of operations to determine the overlay. The determination may use an assumption that the amplitude and phase are unequal in the +1 and −1 diffraction orders.

17 Claims, 9 Drawing Sheets

(51) Int. Cl.
    *G01B 11/27*           (2006.01)
    *G06T 7/00*            (2017.01)

(56) References Cited

U.S. PATENT DOCUMENTS

| | | |
|---|---|---|
| 9,476,698 B2 | 10/2016 | Abdulhalim et al. |
| 9,719,920 B2 | 8/2017 | Grunzweig et al. |
| 10,303,153 B2 | 5/2019 | Czerkas et al. |
| 2007/0008533 A1 | 1/2007 | Ghinovker |
| 2010/0284008 A1* | 11/2010 | Coene .................. G03F 7/70633 356/401 |
| 2012/0013881 A1* | 1/2012 | Den Boef .............. G03B 27/52 355/67 |
| 2012/0206703 A1* | 8/2012 | Bhattacharyya ........ G03F 7/705 355/67 |
| 2013/0035888 A1 | 2/2013 | Kandel et al. |
| 2013/0044331 A1 | 2/2013 | Manassen et al. |
| 2013/0054186 A1* | 2/2013 | Den Boef ............. H01L 23/544 702/150 |
| 2014/0060148 A1 | 3/2014 | Amit et al. |
| 2014/0111791 A1 | 4/2014 | Manassen et al. |
| 2014/0168650 A1 | 6/2014 | Manassen et al. |
| 2015/0146188 A1 | 5/2015 | Lyulina et al. |
| 2015/0316490 A1 | 11/2015 | Amit et al. |
| 2016/0011523 A1 | 1/2016 | Singh et al. |
| 2016/0327906 A1* | 11/2016 | Futterer ............ G02F 1/133553 |
| 2017/0052454 A1* | 2/2017 | Jak ........................ G03F 7/7065 |
| 2017/0146915 A1* | 5/2017 | Levinski ............. G03F 7/70633 |
| 2017/0268869 A1* | 9/2017 | Levinski ............. G01B 9/0201 |

\* cited by examiner

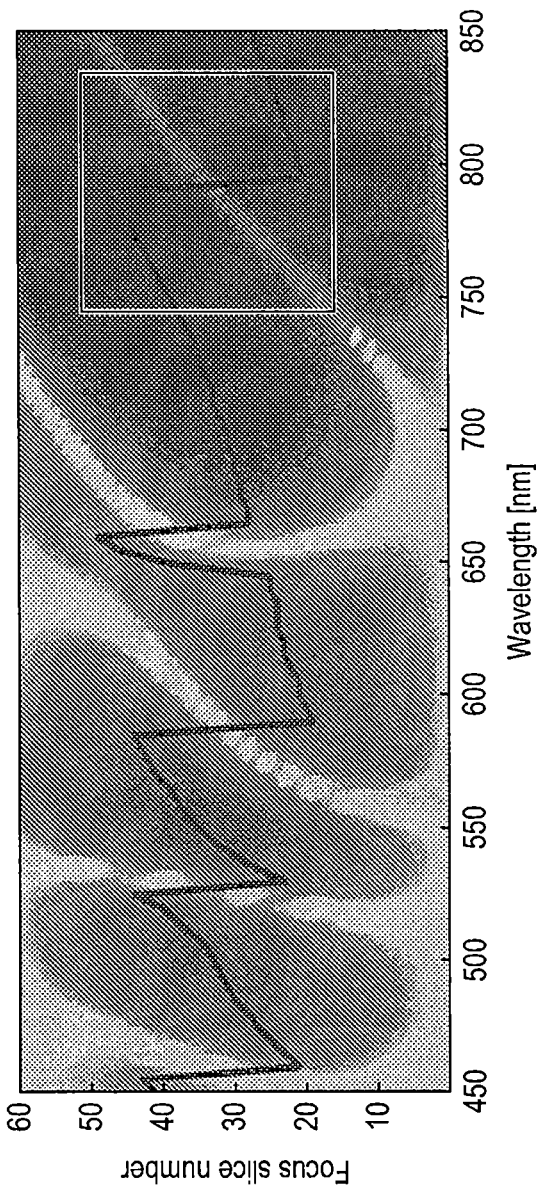
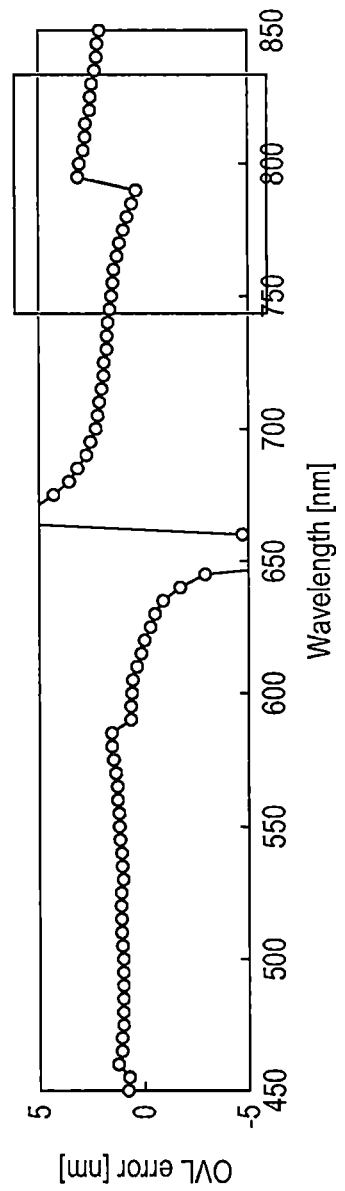
FIG. 1A
FIG. 1B

OVERLAY MEASUREMENT USING PHASE AND AMPLITUDE MODELING

BACKGROUND OF THE INVENTION

Technical Field

The present invention relates generally to the field of semiconductor metrology. In a layered manufacturing process such as the manufacture of semiconductor wafers, it is necessary for printed patterns in respective layers to be properly aligned when laid down in order for the manufacturing process and the eventual manufactured products to function correctly. As is well known in the art the alignment may be assisted through the use of a dedicated metrology target, such as a diffraction grating printed on at least some of the layers. The degree of alignment of patterns in successive layers of a wafer is determined by overlay measurement. The greater the overlay, the greater is the misalignment.

Discussion of Related Art

Numerous techniques have been proposed for measurement of overlay, and developing manufacturing processes, aimed at further miniaturization, require ever more precise measurement of overlay. Techniques are known in the art to compensate for overlay. The more accurate the overlay measurement, the more accurately the overlay can be compensated for leading to better manufactured device performance. Therefore improvements in overlay measurement can lead to improvements in manufactured devices through known compensation measures.

SUMMARY OF THE INVENTION

The following is a simplified summary providing an initial understanding of the invention. The summary does not necessarily identify key elements nor limits the scope of the invention, but merely serves as an introduction to the following description.

Some embodiments of this invention provide methods and systems for determining overlay in a semiconductor manufacturing process. Radiation reflected from a diffraction grating in a metrology target may include +1 and −1 diffraction patterns at different wavelengths and optionally also different focal positions. According to some embodiments of the invention, the different wavelengths of radiation are in a waveband including a maximum in sensitivity of contrast to wavelength. The reflected radiation may be analysed to obtain measured values of overlay as well as amplitude and/or phase corresponding to points distributed over the target, for different wavelengths and focal positions. The measured values of overlay may undergo a series of operations to determine the overlay. The determination may use an assumption that the amplitude and phase are unequal in the +1 and −1 diffraction orders. Systems according to some embodiments of the invention may comprise an illumination system and an imaging system, a control unit arranged to control the imaging system or the illumination system or both; and an image analysis unit configured to carry out any of the methods described herein, for example through the use of an algorithm controlling the operation of a processor in the image analysis unit. Some embodiments also comprise a computer readable medium comprising instructions for implementation by a processor in an image analysis unit.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIG. 1A is a graph showing variation of contrast with wavelength and focal position;

FIG. 1B is a graph corresponding to FIG. 1A showing variation of overlay error, or metrology error, with wavelength, at a focus position of greatest contrast, according to some embodiments of the invention;

FIGS. 2A to 2C show the results of modelling variations of amplitude, or amplitude reconstruction, assuming symmetry between the +1 and −1 diffraction orders according to some embodiments of the invention;

DETAILED DESCRIPTION OF THE INVENTION

Figure 2A:
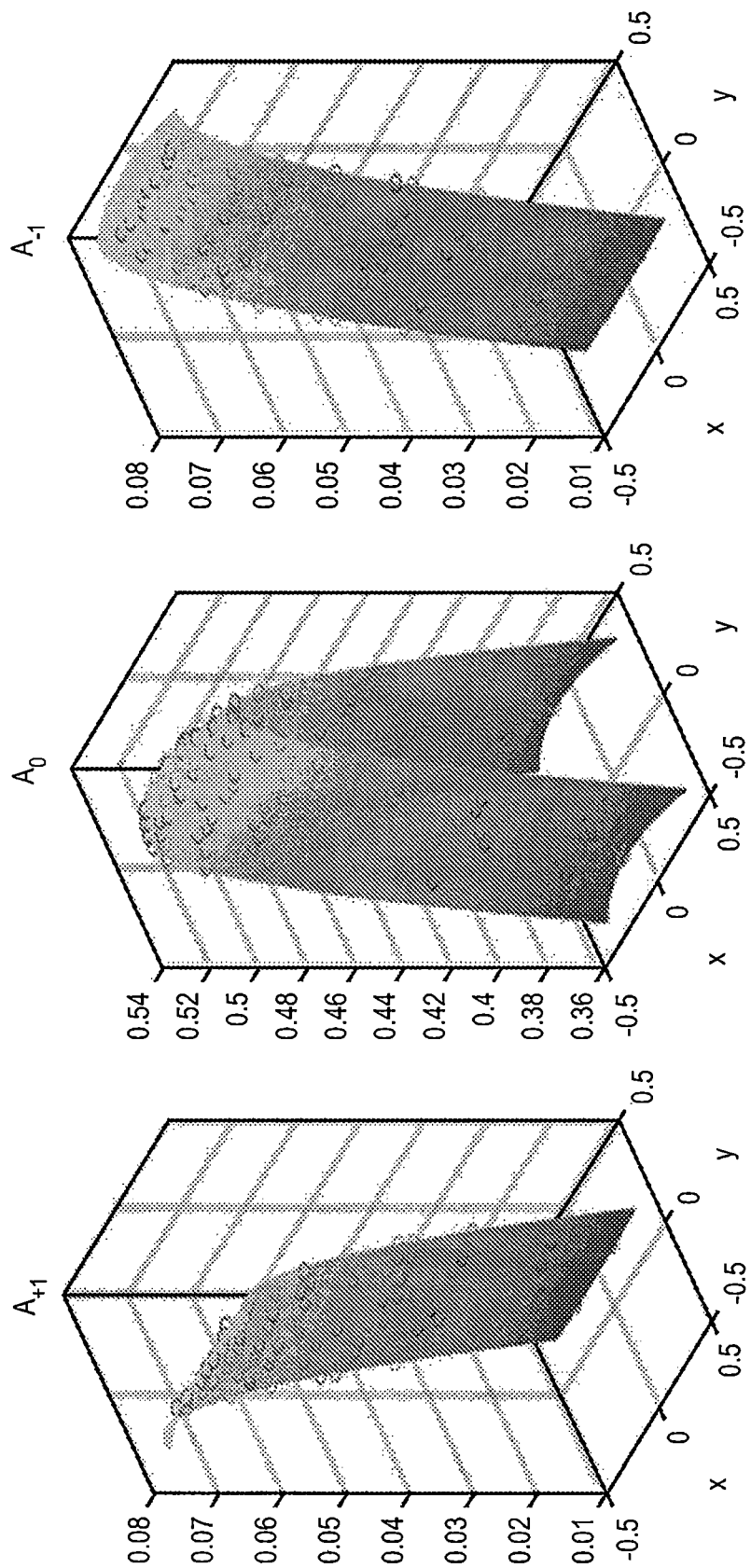

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein is for the purpose of description and should not be regarded as limiting.

A method according to the invention may begin with capturing radiation reflected from a metrology target. In the following explanation reference is made to a diffraction grating, or simply grating, as an example of a metrology target that may be used to cause diffraction of incident radiation.

Alternatively a method according to the invention may comprise analysing previously captured image data. For example the invention in some embodiments may provide an algorithm that calculates and tracks the overlay between overlapping gratings and/or the center of symmetry of a single grating which can be part of an overlay, alignment or edge placement error (EPE) target (an EPE target is used to measure the shift between features generated in the same lithography step).

The analysis may be performed for example in a processor in an analysis unit in a metrology system, and therefore the invention may be implemented by suitably configuring a currently available metrology system. Thus some embodiments of the invention may provide a computer readable medium comprising instructions which, when implemented in a processor, cause the processor to perform the operations described further herein.

The term "overlay" is used herein unless otherwise stated to refer to the difference in position between two targets in different, e.g. successive, layers in a product being manufactured such as a semiconductor wafer. This may be deliberate, for example targets may be deliberately offset for calibration purposes, or the result of errors in the manufacturing process that it is desirable to correct. Thus reflected radiation from a target may include radiation from overlapping targets in different layers. Overlay may be measured as a difference in grating positions in respective layers. A measurement of overlay obtained by a metrology tool, also referred to herein as an imaging tool, for example using an image capturing device, may be subject to errors induced by any of tool inaccuracies, asymmetry in the target and other factors. An objective of overlay measurement is to correct such errors, referred to herein as "overlay error", or "metrology error".

The term "amplitude" is used herein unless otherwise stated to refer to the amplitude of radiation reflected from a target, e.g. the total amplitude of a waveform which may include different wavelength components. The amplitude is usually measured with respect to the tool numerical aperture, for example by a pupil camera.

The term "intensity" is used herein unless otherwise stated to refer to the intensity, or gray level in an image. The image is also referred to as the "kernel". The distribution of intensity over an image is indicative of the image contrast, as explained further herein. Measurements of intensity are usually measured at an imaging tool focal plane, Radiation reflected from a metrology target may include +1 and −1 diffraction patterns at different wavelengths and focal positions. The radiation may be analysed to obtain measured values of overlay and amplitude and/or phase corresponding to points distributed over the target, for different wavelengths and focal positions. Some embodiments of the invention may use measured values of amplitude without using measured values of phase, others may use measured values of phase without using measured values of amplitude. In the embodiments described in further detail herein by way of example only and not intended to be limiting, overlay is determined using measured values of both amplitude and phase.

The measured values of amplitude, phase and overlay may then be subject to the following operations:

fitting the values of amplitude and phase to a first model of the variation of amplitude and phase over the image plane, for example the capturing device numerical aperture, in which it is assumed that the amplitude and phase are equal and opposite in the +1 and −1 diffraction patterns;

this operation is also referred to herein as symmetric amplitude and phase reconstruction; it may be used to obtain values of amplitude and phase corresponding to values of wavelength and focal position, for example to fill in the gaps between discrete measurement points, which in turn may be used to estimate overlay for different combinations of wavelength and focal position;

fitting the estimated values and measured values of overlay to a second model of the variation of amplitude and phase over the image plane in which it is assumed that there is a difference in the amplitude and phase between the +1 and −1 diffraction patterns;

this operation is also referred to herein as applying asymmetry difference; it may be used to obtain values of amplitude difference and phase difference corresponding to different values of wavelength and focal position;

using values of amplitude and phase difference at a selected wavelength to determine the overlay.

The selected wavelength may be the wavelength at which the sensitivity of contrast to wavelength is at a maximum, in other words at a contrast reveral point, The analysis and fitting operations may be carried out for every overlay measurement, for example if this can be performed with sufficient speed, or alternatively it might be carried out less frequently, for example as part of a calibration operation.

According to some embodiments of the invention, the wavelengths and/or focal positions used to obtain image data to be analysed may be in a "contrast reversal" region. This is briefly explained with reference to FIGS. 1A and 1B.

As with all images, radiation reflected from a diffraction grating in a metrology target may be characterised according to contrast. Contrast is a measure of the distribution of intensity values in an image. A number of formulae are known in the art for quantifying contrast, one of which is used in embodiments of the invention described herein by way of example. The contrast in an image of a metrology grating may be sensitive to wavelength. The different wavelengths used in the determination of overlay according to some embodiments of this invention may be in a wavelength region including a maximum in sensitivity of contrast to wavelength and/or only first order diffraction patterns are present. There may be more than one such region in the available wavelengths in a metrology tool. This is explained in more detail with reference to FIGS. 1A and 1B.

FIG. 1A is a graph showing variation of contrast with wavelength and focal position, also known as "focus slice number". FIG. 1A may be considered to be a contrast map. The grayscale indicates magnitude of contrast, where black indicates maximum contrast and white indicates minimum contrast. The solid black line indicates the best focus slice per wavelength. FIG. 1B is a graph corresponding to FIG. 1A showing variation of measured overlay error with wavelength at a focus position where the contrast is greatest, represented by the solid black line in FIG. 1A.

There are several wavelength regions in FIG. 1A where the magnitude of the contrast decreases to a minimum before increasing again, known as contrast "reversal". The rightmost such region, indicated by the inset square, includes only first order diffraction patterns. The other contrast reversal regions include higher diffraction orders. According to some embodiments of the invention, the different wavelengths of radiation analysed are in a waveband where the sensitivity of contrast to wavelength is at a maximum, in other words around a contrast reversal region. Additionally according to some embodiments of the invention, only first order diffraction patterns are present in the contrast reveral region. The benefits of confinement to a contrast reversal region are described further herein. Methods according to some embodiments of the invention may commence with determining an operating waveband including a maximum in sensitivity of contrast to wavelength, optionally including only first order diffraction for simplification of mathematical processing as described further herein. This may be for example part of an initial set up operation. In other embodiments the appropriate wavelength region may have been predetermined. Similarly an operating focus range may be determined.

Symmetric Phase and Amplitude Reconstruction

According to some embodiments of the invention, the amplitude A (total amplitude of waveform) and phase Ψ of reflected radiation across a pupil numerical aperture "NA" can be considered to have a polynomic behavior:

$$A^p(NA_x, NA_y) = \sum_{i,j=0}^{s} A^p_{i,j}(NA_x)^i(NA_y)^j \qquad \text{Equation 1}$$

$$\Psi^p(NA_x, NA_y) = \sum_{i,j=0}^{s} \Psi^p_{i,j}(NA_x)^i(NA_y)^j$$

where, $A_{i,j}$ and $\Psi_{i,j}$ are real numbers and i and j are the polynomial coefficients. The superscript p is an integer assigned to the diffraction order. With suitable choice of working region in the contrast map (see FIG. 1A) values of p may be limited, e.g. p=1,0,−1. Equation 1 represents an example of a model of the variation of amplitude and phase over a tool numerical aperture. By obtaining the A's and Ψ's, the periodic signal constructed by the imaging apparatus can be re-constructed as the sum of all orders using the system model represented by Equation 1. Therefore according to some embodiments of the invention, values of amplitude and phase for radiation reflected from a diffraction grating may be fitted to a model, such as that represented by Equation 1, in order to obtain the A's and Ψ's. By fitting the reflected radiation, or real image capture data, to a system model it is possible to estimate values of A's and Ψ's where there is no measured or real data.

The position dependent intensity I obtained by an image capturing device across the x direction, only of the first harmonic, for a particular focus position F and wavelength λ may be represented by:

$$I(x, F, \lambda) = \qquad \text{Equation 2}$$

$$\sum_{NA} A^0(NA_x, NA_y)A^1(NA_x, NA_y)\cos\left(\frac{2\pi n}{\Lambda}(x+\epsilon) + \Psi^0(NA_x, NA_y) - \Psi^1(NA_x, NA_y) + \Delta\varphi(F, \lambda, NA_x, NA_y)\right)$$

where A and Ψ are the phase and amplitudes respectively of radiation reflected from the grating at position x, $\epsilon$ is the overlay, and $\varphi$ is the phase difference between the $\Psi^0$ and $\Psi^{\pm 1}$ at the tool focus position and wavelength, F and λ respectively.

The derivation of Equation 2 is described further herein. For the case where the grating is symmetric, for example there are no asymmetry errors in the formation of the grating, it may be assumed that the amplitudes are equal and the phases are equal and opposite in the +1 and −1 diffraction patterns, represented mathematically as:

$$A^1(NA_x,NA_y)=A^{-1}(-NA_x,-NA_y); \Psi^1(NA_x,NA_y)=\Psi^{-1}(-NA_x,-NA_y) \qquad \text{Equation 3:}$$

The image profile of the first order amplitude can be represented by C, also referred to herein as contrast, as follows:

$$C(F, \lambda) = \qquad \text{Equation 4}$$

$$\sum_{NA} 2A^0(NA_x, NA_y)A^1(NA_x, NA_y)\cos(\Delta\varphi(NA_x, NA_y, F, \lambda))$$

where:

$$\Delta\varphi(NA_x,NA_y,F,\lambda)=2(\Psi^1(NA_x,NA_y,\lambda)-\Psi^0(F,\lambda)-\varphi(F,\lambda)) \qquad \text{Equation 5:}$$

In order to obtain the contrast map of FIG. 1, values of 1/C were plotted for different values of focus slice and wavelength. Both C and 1/C are values that quantify contrast in the reflected radiation, and other values that quantify contrast may be used in some embodiments of the invention.

A fitting operation in which measured data is fitted to a model may involve minimizing differences between measured and actual values of a parameter. The fitting of values of amplitude and phase according to some embodiments of the invention may use contrast as the parameter, termed in the art as the feed to a fitting operation, or cost function.

In fitting, or training, the $A_{i,j}^p$ and $\Psi_{i,j}^p$ values a number of assumptions or constraints may be used. The pitch of the grating together with the illumination light may be designed so that only the zero and first diffraction orders are being collected by the collection NA. Consideration of the illumination NA will be discussed further herein.

It follows from this constraint:

p=1=the maximum diffracted orders s=2=the order of the polynomic dependency of the diffracted order across the pupil.

Though focus, or slice information is collected, as the scattered light does not depend on the focus position, around the focus depth. It can be assumed:

$$\frac{\partial A_{i,j}^p}{\partial F} = 0,$$

Under the approximation of a narrow range of wavelengths the scattered light is hardly dependent on the illumination wavelength, therefore:

$$\frac{\partial A_{i,j}^p}{\partial \lambda} << A_{i,j}^p$$

As noted above, values of amplitude and phase may be fitted to a symmetrical model so as to minimise differences in contrast between measured values and approximated values obtained from the model. The fitting may be represented mathematically by the following cost function:

$$\chi\left(\overline{A_{i,j}^P}, \overline{\Psi_{i,j}^P}\right) = \quad \text{Equation 6}$$

$$\sum_{F,\lambda}\left(C_{measured}(F,\lambda) - C_{Approximated}\left(F, \lambda, \overline{A_{i,j}^P}, \overline{\Psi_{i,j}^P}\right)\right)^2$$

where the notation $\overline{A_{i,j}^p}$ indicates a vector or matrix with different values of i and j.

In case of optical metrology, the number of the phase and the amplitude can be approximated as a two-dimensional 2nd order polynomial. For a set of 3 orders (+1, 0 and −1) and 2 polarizations there are 56 free parameters. These parameters may be varied as part of the fitting process to minimize the difference in C in equation 6.

If the foregoing assumptions and constraints do not hold or are not met, a more complicated formula may be used, for example with additional diffraction orders or some dependency of A vs. focus or optional other complications or any combination of the foregoing.

Figure 2B:
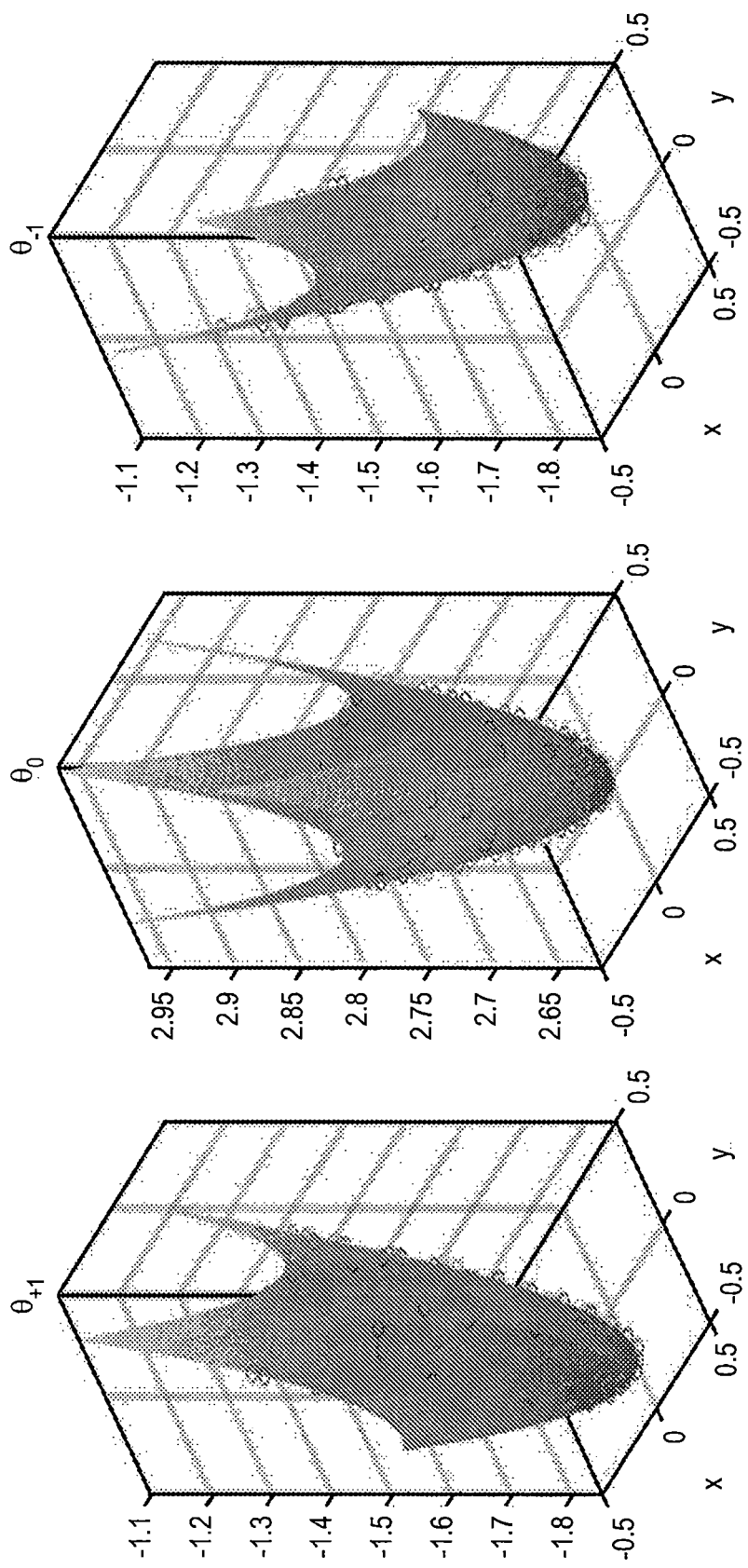

FIGS. 2A to 2C show the results of modelling variations of amplitude, or amplitude reconstruction, assuming symmetry between the +1 and −1 diffraction orders according to some embodiments of the invention. FIGS. 2D to 2F show similar results for phase. In FIGS. 2A-2F the dots represent actual data and the three dimensional curves represent the fitting of the data to the polynomial model.

After reconstructing values of $A_{i,j}{}^p$ and $\Psi_{i,j}{}^p$, the overlay ε may be determined. An approximation of the overlay ε may be determined using Equation 2 for different values of F and X (where all the variables except for c are now known). The approximated overlay values may then be fitted to a second model of the variation of amplitude and phase over the image plane in which it is assumed that the amplitude and phase are unequal in the +1 and −1 diffraction patterns.

Applying Asymmetry Difference

Asymmetry in one or both of the amplitude and phase in the +1 and −1 diffraction patterns may be due to asymmetry in the grating or some other cause. The asymmetric behavior of amplitude and phase can be approximated also by an 2D polynomial of the form:

$$\Delta A^P(NA_x, NA_y) = \sum_{i,j=0}^{s} \Delta A_{i,j}(NA_x)^i(NA_y)^j \quad \text{Equation 7}$$

$$\Delta \Psi^P(NA_x, NA_y) = \sum_{i,j=0}^{s} \Delta \Psi_{i,j}(NA_x)^i(NA_y)^j$$

Here ΔA represents a difference in amplitude between the +1 and −1 diffraction patterns and ΔΨ represents a difference in phase between the +1 and −1 diffraction patterns.

The overlay may be calculated using summation over the kernel with Equations 2 and 3, under the approximation $A^{\pm 1} = A^1 \pm \Delta A$ and $\Psi^{\pm 1} = \Psi^1 \pm \Delta \Psi$, described further herein.

Put mathematically, the fitting to the asymmetric model may be represented by:

$$\chi\left(\overline{\Delta A_{i,j}^P}, \overline{\Delta \Psi_{i,J}^P}\right) = \quad \text{Equation 8}$$

$$\sum_{F,\lambda}\left(\epsilon_{measured}(F,\lambda) - \epsilon_{Approximated}\left(F, \lambda, \overline{\Delta A_{i,j}^P}, \overline{\Delta \Psi_{i,J}^P}\right)\right)^2,$$

where $\epsilon_{measured}$ is the position of the grating, or overlay as measured from a tool, while $\epsilon_{Approximated}$ follows the summation of Equation 2, for any amplitude and phase difference. The aim of the fitting operation may be to minimize the term on the right of equation 8.

The fitting operation represented by equation 8 uses overlay as the parameter for which differences are to be minimized. In other words, a method according to some embodiments of the invention may include a second fitting operation in which the feed to the cost function (equation 8) is overlay.

The fitting operation may comprise varying values of ΔA and ΔΨ to arrive at a minimum difference between measured and estimated overlay. In other words, the symmetrical model is perturbed using values of ΔA and ΔΨ. The values of ΔA and ΔΨ corresponding to the minimum cost function may then be used to determine overlay as described further herein.

The benefits of operating in a contrast reversal region will now be described further herein.

Reconstruction in Contrast Reversal Region

At contrast reversal points, where the contrast minimizes, the sensitivity of a system to $(\overline{A_{i,j}{}^p}, \overline{\Psi_{i,j}{}^p})$ maximizes. In particular, the sensitivity to the phase difference between zero and first order increases. This can be shown from the cost function Eq. 6, detailed further herein.

Differences in phase are a property of, or result of, a stack of layers in a wafer and not of the tool, e.g. image capturing device. Following Equation 4, the phases (Ψ's) weakly depend on wavelength and are independent of focus. Analyzing Equation 4 it can be seen that the contrast C vanishes with the cosine. Its domain consists only of the order phases, Ψ's, the wavelength, λ, and the tool focus, F.

The goal is to maximize the sensitivity to contrast in $$\Delta \varphi \cong \frac{\pi}{2}.$$

Figure 3A:
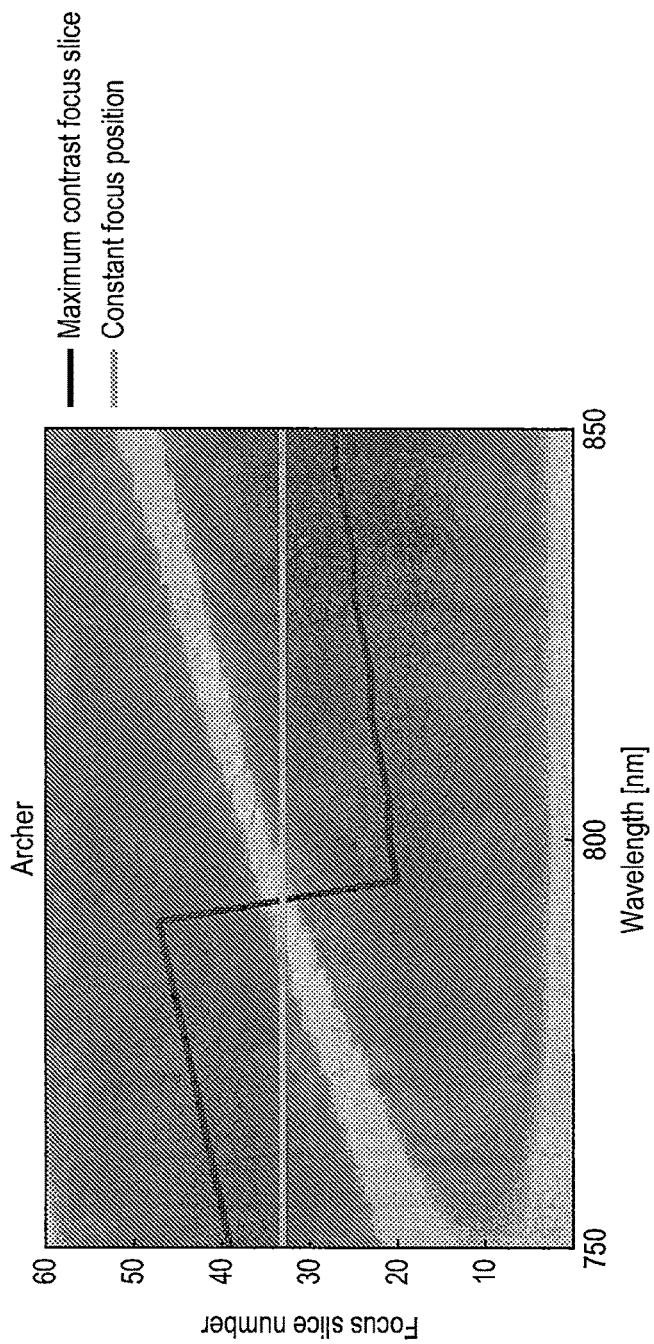
FIGS. 3A and 3B shows overlay determined at the focus where the contrast is at maximum, corresponding to each wavelength.
Figure 3B:
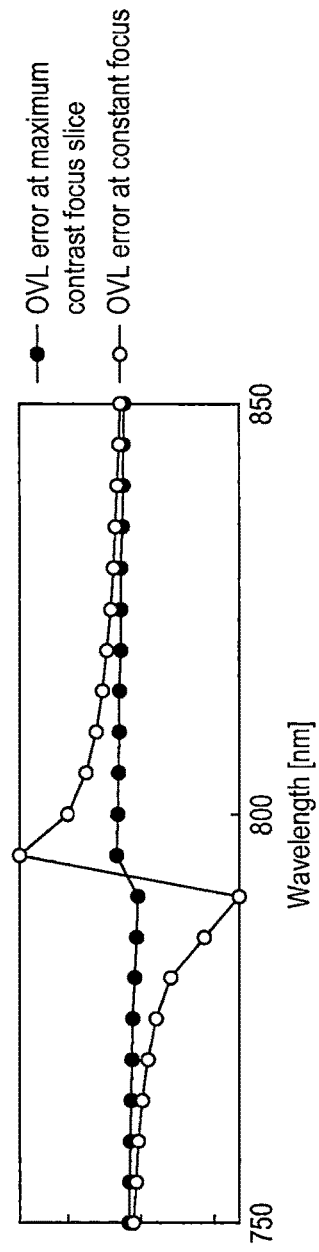

This phase condition can be achieved by varying either the focus or the wavelength. This produces a contour of focus and wavelength where C vanishes, hence contrast reversal, as seen in FIG. 1A. FIGS. 3A and 3B are graphs corresponding to FIG. 1 limited to the square focus and wavelength region shown in FIG. 1A. FIG. 3B shows overlay (OVL) determined at the focus, where the contrast is at maximum, corresponding to each wavelength. FIG. 3B additionally shows variation of overlay error with wavelength at a constant focus position, corresponding to the solid horizontal line in FIG. 3A.

Figure 4B:
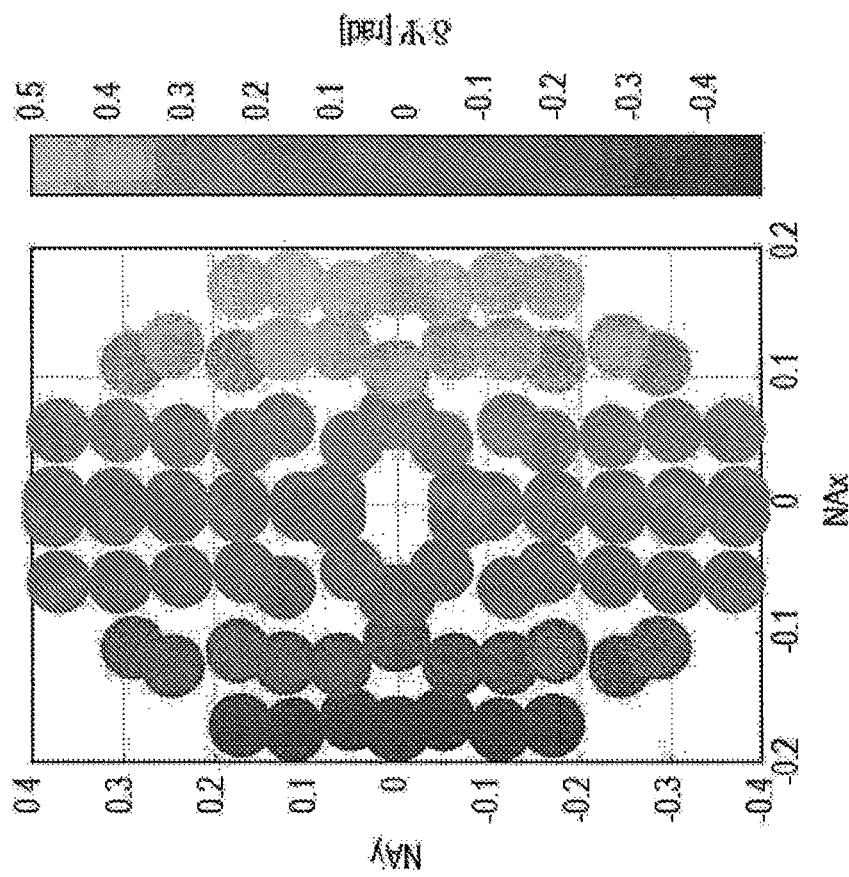
FIGS. 4A and 4B show respectively variation of phase and amplitude difference between the +1 and −1 diffraction orders over a numerical aperture.
Figure 4A:
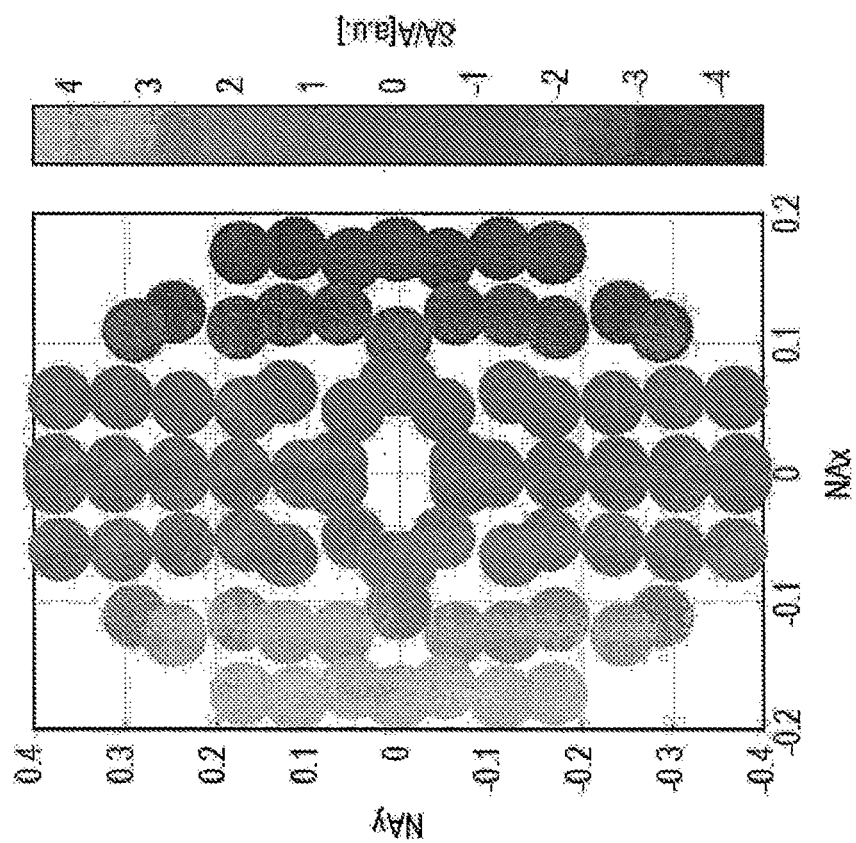

FIGS. 4A and 4B show respectively variation of phase and amplitude difference between the +1 and −1 diffraction orders over a numerical aperture. It will be noted from the scale that the phase differences are less than 0.001% whereas the amplitude differences are in the region of 0-2%. A measurement of overlay may be determined as a weighted sum of measurements over a set of illumination points. The amplitude and phase differences may be used to weight the sum.

Derivation of Weighted Sum

Equation 2 is a non-limiting example of a polynomial function that may be used in the reconstruction, or fitting, of phase and amplitude values. Its derivation is now explained. The explanation builds on work already disclosed in US20170146915 A1.

It is assumed that the imaging tool, or image capturing device, collected only the first diffracted order. This can be arranged by suitable configuration of a tool or device as is known to those skilled in the art. It may then be assumed that the ratio of the center wavelength and the pitch follow $$\frac{\lambda}{\Lambda} < 0.5 - NA/2 \qquad \text{Equation 9}$$

where $\lambda$ and $\Lambda$ are the central wavelength and the grating pitch respectively, and NA is the illumination NA size. The illumination NA may not be constrained to be small, in which case the collection NA may be arranged to be small enough so as not to collect higher order diffraction. This condition assures that the constructed kernel will possess only the first and second harmonic, or the zero and first diffraction orders.

Each illumination point in the illumination NA may be assumed to correspond to a wave vector $\overline{k_l}$. The diffracted electric optical field E of this illumination point can be taken into account by looking only on the propagating orders that will be collected by the collection NA (imaging system):

$$E = A_{+1}(\overline{k})e^{i\overline{k_1}\overline{r}} + A_o(\overline{k})e^{i\overline{k_0}\overline{r}} + A_o(\overline{k_l})e^{i\overline{k_{-1}}\overline{r}} \qquad \text{Equation 10:}$$

where values of A are complex numbers and $\bar{r}$ is the position in space. The wave vector of each order may be represented by:

$$\overline{k_n} = \left(k_x + \frac{2\pi}{p}n\right)\hat{x} + k_y\hat{x} + \sqrt{\left(\frac{2\pi}{\lambda}\right)^2 - \left(k_x + \frac{2\pi}{p}n\right)^2 - k_y^2}\,\hat{z} \qquad \text{Equation 11}$$

where the wave vector $(k_x, k_y, k_z)$ is constrained by the illumination NA and can solely depend on the $\sqrt{NA_x^2 + NA_y^2} > NA$. The common NA used in optical metrology for overlay is about 0.2-0.4, but can reach 0.5 if a rotated apodizer configuration is used, for example as shown in US20150022822A1.

The orders propagating in the imaging apparatus sustain phase retardation. The phase difference between the three orders obtained from the defocus position $\Delta F$, $$E(x, y, k) = A_1 e^{i(k_x + \frac{2\pi}{p})x + ik_y y + i(k_{1z} + |k_{iz}|)\Delta F} + A_0 e^{i(k_x x + k_y y) + 2i|k_{iz}|\Delta F \hat{z}} + A_1 e^{i(k_x - \frac{2\pi}{p})x + ik_y y + i(k_{-1z} + |k_{iz}|)\Delta F} \qquad \text{Equation 12}$$

Here, the reflected intensity $(A_{0,-1,1})$ is complex. Equation 12 shows only the first harmonic order of the constructed kernel, filtering out the DC and the second harmonic coming from the interference between the ±1 diffracted orders.

$$S_1(x, y, k) \propto |E_1(x, y, k)|^2 = \qquad \text{Equation 13}$$
$$2\text{Re}\left(A_1(k)A_0^*(k)e^{i\frac{2\pi}{p}x + i(k_{1z} + |k_{iz}|)\Delta F} + A_{-1}(k)A_0^*(k)e^{i\frac{2\pi}{p}x + i(k_{-1z} + |k_{iz}|)\Delta F}\right)$$

The complex amplitude can be represented by amplitude and phase $A = A\,e^{i\Psi}$.

Hence Equation 13 can transformed to:

$$S_1(x, y, k) \propto |E_1(x, y, k)|^2 = \qquad \text{Equation 14}$$
$$A_0(k)A_1(k)\cos\left(\frac{2\pi}{p}x + (k_{1z} + |k_{iz}|)\Delta F + \Psi_1 - \Psi_0(k)\right) +$$
$$A_0(k)A_{-1}(k)\cos\left(-\frac{2\pi}{p}x + (k_{-1z} - |k_{iz}|)\Delta F + \Psi_{-1} - \Psi_0(k)\right)$$

At a given focus slice ($\Delta F$) the imaged kernel is the summation of Equation 14 on all the illumination points which are collected. Before we move to summation on all illumination points represented by k, we consider the case of a symmetric grating. In a symmetric grating it may be assumed that for antipodal ($\overline{k_\perp} = -\overline{k_\perp}$) points of the illumination $$A_0(\overline{k_\perp}) = A_0(-\overline{k_\perp})$$
$$A_1(\overline{k_\perp}) = A_{-1}(-\overline{k_\perp}) \qquad \text{Equation 15:}$$

Assuming the symmetric grating then:

$$A_0(k)A_1(k)\cos\left(\frac{2\pi}{p}x + (k_{1z} + |k_{iz}|)\Delta F + \Psi_1 - \Psi_0(k)\right) + \qquad \text{Equation 16}$$
$$A_0(k)A_1(k)\cos\left(-\frac{2\pi}{p}x + (k_{1z} - |k_{iz}|)\Delta F + \Psi_1(k) - \Psi_0(k)\right)$$

which gives $$2A_0(k)A_1(k)\cos\left(\frac{2\pi}{p}x\right)\cos((k_{1z} - |k_{iz}|)\Delta F + \Psi_1(k) - \Psi_0(k))$$

In FIGS. 1A and 3A the contrast versus focus and wavelength are plotted. In FIG. 3 due to the long wavelength of 800 nm, grating pitch of 1600 nm and NA of 0.42, the conditions for a single collected order exist. Hence the contrast across focus and around contrast reversal point, as the contrast is not affected by overlay the contrast can be regressed according to the cost function of Eq. 4.

For asymmetric grating:

$$A(-k)_{-1} = A_1(k) + \Delta A_1(k)$$
$$\Psi(-k)_{-1} = \Psi_1(k) + \Delta\Psi(k) \qquad \text{Equation 17:}$$

Assuming an asymmetric grating $$A_0(k)(A_1(k) + \Delta a_1(k)/2)\cos\left(\frac{2\pi}{p}x + \Delta\varphi(k) + \Delta\Psi_1(k)/2\right) + \qquad \text{Equation 18}$$
$$A_0(k)(A_1(k) - \Delta A_1(k)/2)\cos\left(-\frac{2\pi}{p}x + \Delta\varphi(k) - \Delta\Psi_1(k)/2\right)$$

Taking only the first and second leading orders gives $$A_0(k)A_1(k)\cos\left(\frac{2\pi}{p}x + \frac{\Delta\Psi_1(k)}{2}\right)\cos(\Delta\varphi(k, \Delta F)) - \qquad \text{Equation 19}$$
$$A_0(k)\Delta A_1(k)/2\sin\left(\frac{2\pi}{p}x + \frac{\Delta\Psi_1(k)}{2}\right)\sin(\Delta\varphi(k, \Delta F))$$

As sensitivity to the grating position (error in overlay) exists due both $\Delta a$ and $\Delta\Psi$, around contrast reversal both can be recovered effectively.

At contrast reversal points the following may hold:

$$\Delta\varphi(k, \Delta F) = \frac{pi}{2},$$

hence $$-A_0(k)\Delta A_1(k)/2\sin\left(\frac{2\pi}{p}x + \frac{\Delta\Psi_1(k)}{2}\right)\sin(\Delta\varphi(k, \Delta F)) \quad \text{Equation 20}$$

where the highest sensitivity to both $\Delta a$ and $\Delta\Psi$ is present.

Overlay Weighted Average

Following the extraction of the pupil, e.g. capturing an image of a grating, the overlay can be found as the weighted average over all the illumination points k using only the the phase difference $\Psi$ between the first orders, represented generally by $$\Sigma_k W_k(\Psi_1(k) - \Psi_{-1}(k))2\pi/P \quad \text{Equation 21:}$$

where values of W are weights, or coefficients, for the different illumination points.

Equation 21 represents a weighted average of amplitude A over all the illumination points (k), or over all pupil points. The overlay may be derived from the phase difference between the $\Psi+1$ and $\Psi-1$ as is known in the art, for example it may be measured as a phase portion of the periodic grating and using the pitch (p/2pi) transformed to nm.

According to some embodiments of the invention, the measured values of amplitude may be used as coefficients in equation 21, for example the amplitude difference between the +1 and −1 diffraction order, represented by Equation 22:

$$\text{Overlay} = \frac{\sum_k ((A_1(k) + A_{-1}(k))/A_0(k))(\Psi_1(k) - \Psi_{-1}(k))}{\sum_k ((A_1(k) + A_{-1}(k))/A_0(k))} P/2\pi$$

Here, the weight is the average between A+1 and A−1, normalized by the reflective zero order A0. This ratio gives the diffraction efficiency. In total we have an overlay value that is not dependent on the tool (focus) and is not amplified or affected by amplitude asymmetry.

The weights may be determined in various other ways. According to some embodiments of the invention the weights may be determined through the use of machine learning. For example, an initial set of coefficients may be modified to improve the determination of overlay by comparing overlay determined using equation 21, according to one of the methods described herein, with overlay determined by a different technique that is assumed to be more accurate. Various different techniques will be familiar to those skilled in the art. One possibility is to measure OVL using a scanning electron microscope (SEM), which may be used periodically in a production process to perform OVL measurements and to inspect articles for possible other defects. Machine learning may lead to the use additional factors to derive coefficients that depend on amplitude measurements, or to the use of different coefficients that may not depend on or be related to amplitude. More generally the per-pixel, or per illumination point information described herein may be used in conjunction with machine learning to model a relationship between the information and overlay.

For background information on the use of machine learning in conjunction with per-pixel information reference is made to US2015/0316490A1. A machine learning method may comprise fitting information on amplitude and/or phase from different illumination points to a model relating the information to overlay, and updating the model, e.g. coefficients and their magnitudes, based on measurements of overlay obtained by a different technique.

Figure 5A:
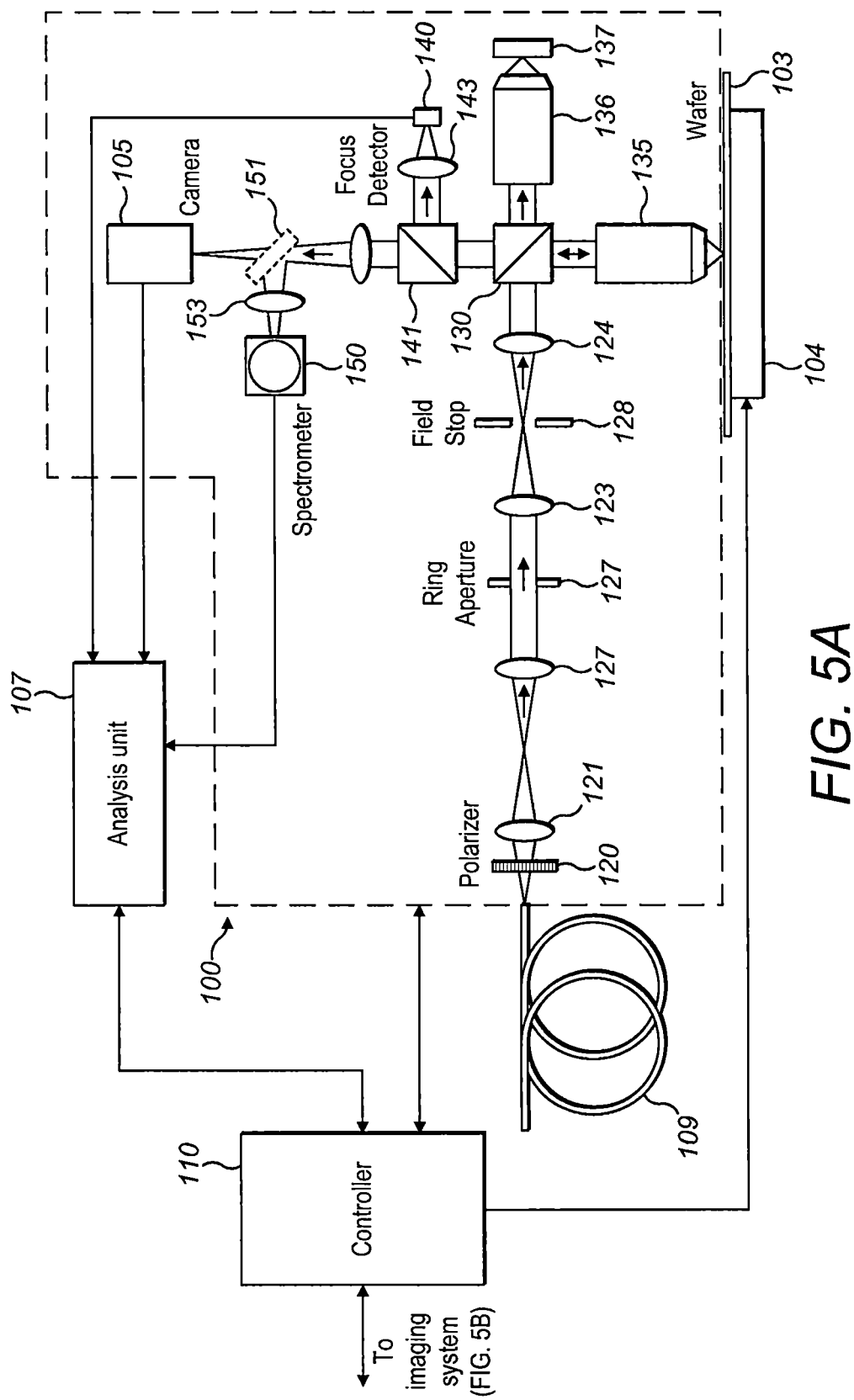
FIGS. 5A, 5B and 5C are schematic diagrams of a system according to some embodiments of the present invention.
Figure 5B:
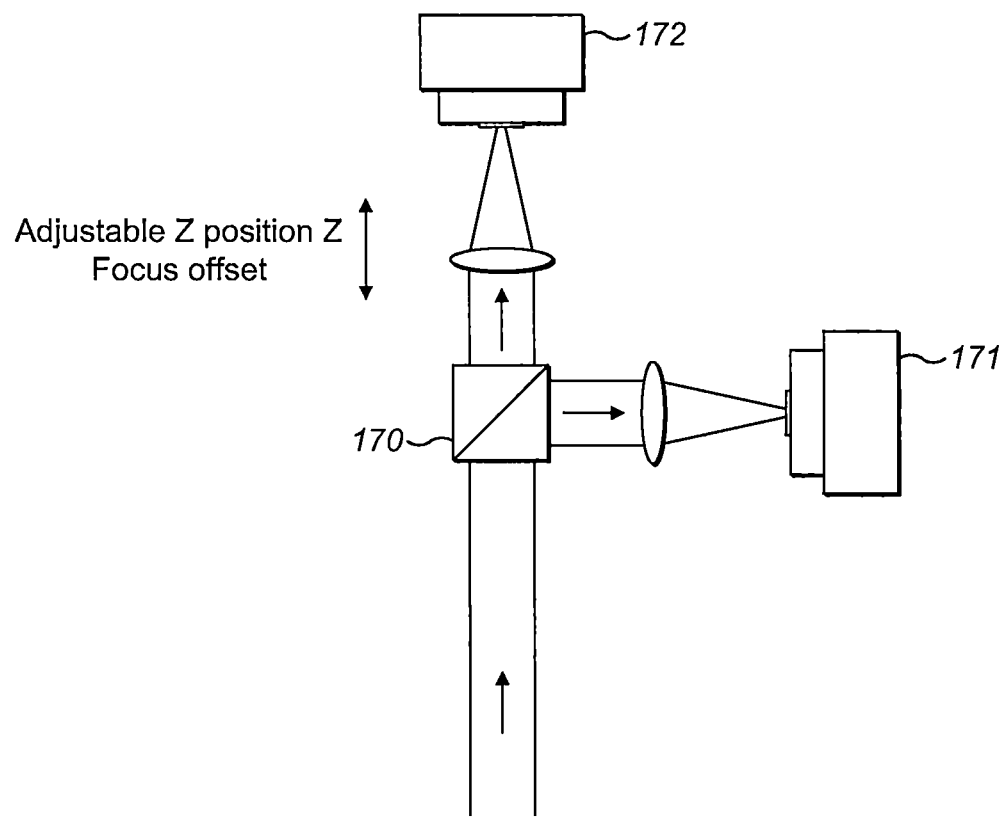
Figure 5C:
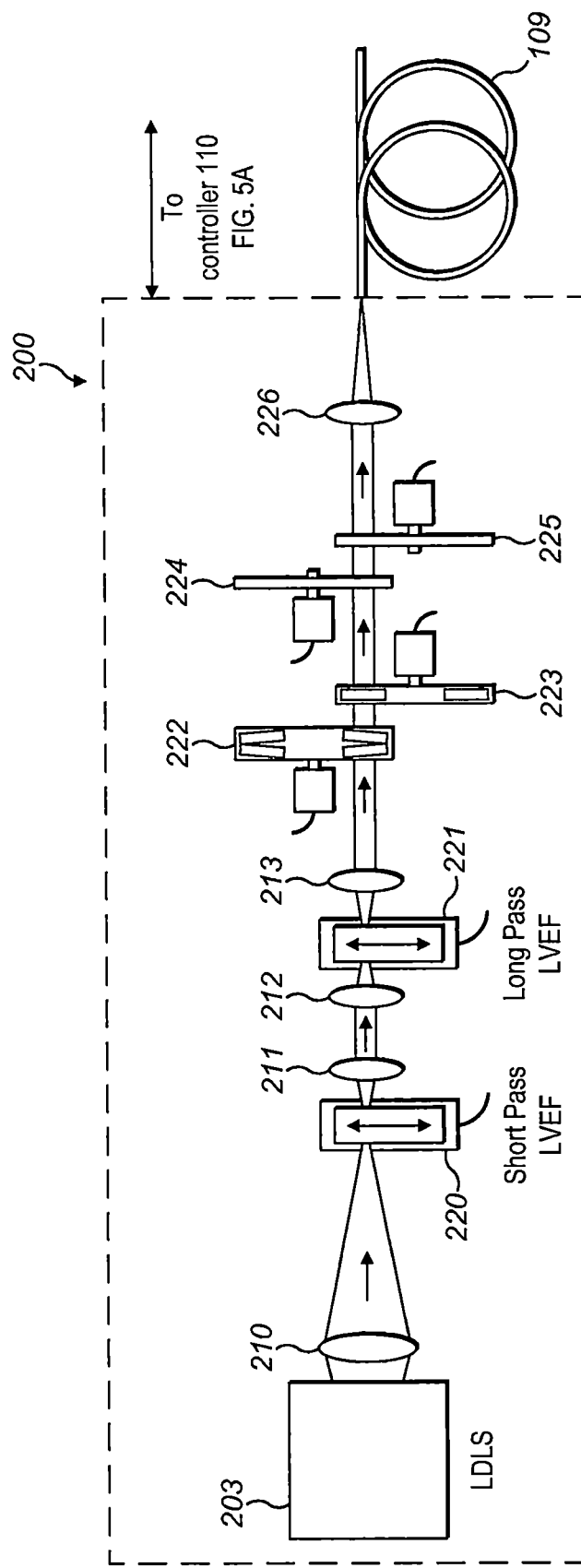

FIGS. 5A, 5B and 5C are schematic diagrams of a system according to some embodiments of the invention for use in manufacturing semiconductor wafers and for measuring overlay. Systems and methods as described herein may be used in the manufacture of other products, for example any products which may be imaged to generate a contrast signature as described further herein. The system of FIGS. 5A, 5B and 5C may be used to obtain images of an area of a wafer surface using different values of one or more imaging parameters such as focus and wavelength. Thus the system may be configured such that one or more imaging parameters is variable. The area may include a metrology target e.g. for overlay measurement, such as a diffraction grating.

FIG. 5A shows an imaging tool 100, FIG. 5B shows a possible modification of the imaging tool 100 and FIG. 5C shows an illumination system 200 which may be used to supply radiation to the imaging tool of FIG. 5A.

In the imaging tool 100 of FIG. 5A, radiation, such as visible light, is directed towards the surface of a product, in this illustration wafer 103, on a support 104. The radiation may be directed at a metrology target. Reflected radiation including diffraction patterns is received from the surface of the wafer 103 and captured, for example in an image capturing device or camera 105. The captured diffraction patterns may be analyzed in an analysis unit 107. For example, amplitude and phase information may be derived from the radiation captured by the camera 105 in any manner known to those skilled in the art, for example using multiple measurements and/or pupil interference measurements. The operation of the imaging system may be controlled by a controller 110.

The radiation may be supplied to the imaging tool 100 by an optical fiber 109 and pass through polarizer 120 and lenses 121-124, to reach beam splitter 130. A ring aperture 127 may be positioned between lenses 122 and 123 and a field stop 128 may be positioned between lenses 123 and 124, whose functions will be understood by those skilled in the art. A beam splitter 130 may split the radiation such that one part of the radiation is directed via an objective lens system 135 to the wafer 103 and one different part of the radiation is directed via an objective lens system 136 to a mirror 137. The same pair of objective lens systems 135 and 136 may collect scattered radiation from the wafer 103 and reflected radiation from the mirror 137 and the same beam splitter 130 may combine the radiation from the wafer and the mirror to form a single radiation field whose details are sensitive to the distance between the objective 135 and the wafer 103 (the focus), in a way that allows defocus to be deduced.

Some of the combined radiation may be directed to a focus detector 140, whose function is described further herein. For example some of the combined radiation may be directed to the focus detector 140 by a beam splitter 141 and lens 143. Some of the reflected radiation may be directed to a spectrometer 150. For example some of the reflected radiation may be directed to the spectrometer 150 by a beam splitter 151 and lens 153. The focus detector 140 may perform focus measurements and output signals indicative of those measurements to the analysis unit 107. Similarly the spectrometer 150 may perform spectral measurements and output signals indicative of those measurements to the analysis unit 107.

Camera 105 may be a charge coupled device or "CCD" array. Camera 105 may be arranged, or set, to form an image from the reflected radiation at the "image" plane, as is known in the art. For example the wafer 103 may include a diffraction grating on its surface in which case the reflected radiation may be diffracted radiation from the surface of the wafer 103.

Various ones of the components forming part of the imaging tool 100 of FIG. 5A, or the wafer support 104, may be moved with respect to each other, for example by one or more motors not shown and known to those skilled in the art. The operation of the imaging tool 100, for example the operation of motors forming part of the imaging tool 100, may be controlled by controller 110. The operation of controller 110 may be based in part on signals from analysis unit 107. Analysis unit 107 or controller 110 or both may comprise a computing system including on or more processors. For example a processor in analysis unit may generate and compare contrast signatures according to some embodiments of the invention.

According to some embodiments of the invention, images of a diffraction grating on a wafer may be obtained using different values of one or more imaging parameters. Thus, controller 110 may control imaging tool 100 to vary one or more imaging parameters between successive image capturing operations, for example to form a series of images to be analyzed by analysis unit 107. Thus for example the controller 110 may control the polarizer 120 to change the polarization of the radiation between one image and another. The controller may control the position of any of the lenses, or the wafer support 104, for example lenses in objective lens system 135 with respect to each other or to wafer support 104, to vary the focus and thereby obtain a series of images each with a different degree of focus. The controller may control the operation of the ring aperture 127 to vary the numerical aperture between one image and another. Other imaging parameters which may be varied according to some embodiments of the invention include but are not limited to center wavelength of radiation used to illuminate the wafer and bandwidth of the radiation.

Beam splitter 151 and camera 105 shown in FIG. 5A may be replaced by a dual camera arrangement shown schematically in FIG. 5B. An example of a suitable dual camera arrangement for use in some embodiments of the invention is described in more detail in US20170146915A1. FIG. 5B shows a beam splitter 170 which may replace beam splitter 151 of FIG. 5A, and cameras 171 and 172 which may replace camera 105 of FIG. 5A. The dual camera arrangement may be fixed with respect to the support 104, also known as a stage. The position of one of the cameras, for example 172 as indicated in FIG. 5B, may be movable with respect to the beam splitter 170 to cause a focus offset with respect to the focus of camera 171. Thus according to some embodiments of the invention, different focal positions as referred to elsewhere herein may be achieved through the use of a focus offset. This may avoid the need to move a camera with respect to the stage and has the advantage that the measurement (offset of one camera with respect to the other) is immune to possible movements of the stage which may occur, since both cameras 171 and 172 are equally affected.

Referring now to FIG. 5C, the illumination system 200 according to some embodiments of the invention comprises a source of radiation 203. This may be any suitable radiation source known to those skilled in the art. According to some embodiments of the invention, the source of radiation 203 may comprise multiple radiation sources of different wavelengths and/or bandwidths, from which one or more may be selected, for example in order to vary the wavelength and/or bandwidth used to illuminate a product, or target.

As shown in FIG. 5C, radiation from source 203 passes through a series of lenses 210-214 and filters 220-226 to optical fiber 109. The illumination system 200 may be operable to vary one or more imaging parameters, e.g. parameters which when varied cause a variation in an image captured by an image capturing device, e.g. using the radiation source 203 as a source of illumination. An example of an imaging parameter that may be varied by controlling the illumination system is the wavelength of the radiation. A wafer manufacturing control system may include a variable wavelength illumination system in which case some embodiments of the invention may be implemented by operating an existing system, e.g. existing hardware, in a novel way. According to some embodiments of the invention new hardware or software, including components operable to vary the wavelength of radiation used to illuminate a wafer to be imaged, may be provided.

In the system illustrated in FIG. 5C, filters 222-226 may comprise filters in an existing wafer manufacturing control system such as bandpass and gradient filters whose functions will be known to those skilled in the art. Filters 220 and 221 may be used to vary the wavelength of radiation delivered to imaging tool 100 according to some embodiments of the invention, for example where this cannot be achieved by filters 222-226.

In practice an illumination system may use radiation polarized in different ways in which case differently polarized radiation may be conducted along different channels from the source 203 to the optical fiber 109. Only one channel is illustrated in FIG. 5C for simplicity but it will be appreciated that in a practical system a number of channels may be provided according to the number of polarizations.

According to some embodiments of the invention, the wavelength of radiation used to illuminate the product, e.g. wafer 103, may be varied in any known manner of wavelength variation. A system according to some embodiments of the invention may include mechanical apparatus to filter a narrow band of wavelengths of light from a wider band source. For example, a wide band radiation source may be mechanically distributed by means of a prism from which light in a particular wavelength band, or color, may be mechanically selected, for example using a shutter mechanism. In the example shown in FIG. 5C, filters 211 and 212 may be high pass and low pass filters respectively. Additionally or alternatively, filters 211 and 212 may be tunable as known in the art to vary the wavelength of radiation.

It will be appreciated to one skilled in optics that the order of some of the components shown in FIGS. 5A and 5C, such as lenses and beam splitters, may be varied whilst still enabling the system to operate as described herein. In particular, some of the components of the imaging tool 100 as illustrated may form part of the illumination system 200 and some of the components of the illumination system 200 may form part of the imaging tool 100.

The obtaining of images by camera 105 may be performed under the operation of controller 110 and the analysis may be performed in analysis unit 107, possibly controlled by controller 107. It may be possible to modify existing systems to implement methods according to some embodiments of the invention. Therefore some embodiments of the invention may comprise a computer readable medium, either transitory or non transitory, comprising instructions which when implemented in a controller in a product manufacturing system, cause the system to operate according to the methods described herein.

Methods according to some embodiments of the invention may be performed in analysis unit 107. An example of one such method is shown in FIG. 6.

The flow of FIG. 6 begins at operation 601 with determining an operating waveband including a maximum in sensitivity of contrast to wavelength, optionally including only first order diffraction, as described with reference to FIG. 1. For example, measurements of amplitude may be received at analysis unit 107 from which variation of contrast may be analysed to determine the operating waveband. Similarly in operation 601 an operating focus range may be determined. As noted elsewhere herein this may be part of initial set up operations or may be part of the design of a metrology tool and may not necessary take place in all method embodiments of the invention.

Figure 6:
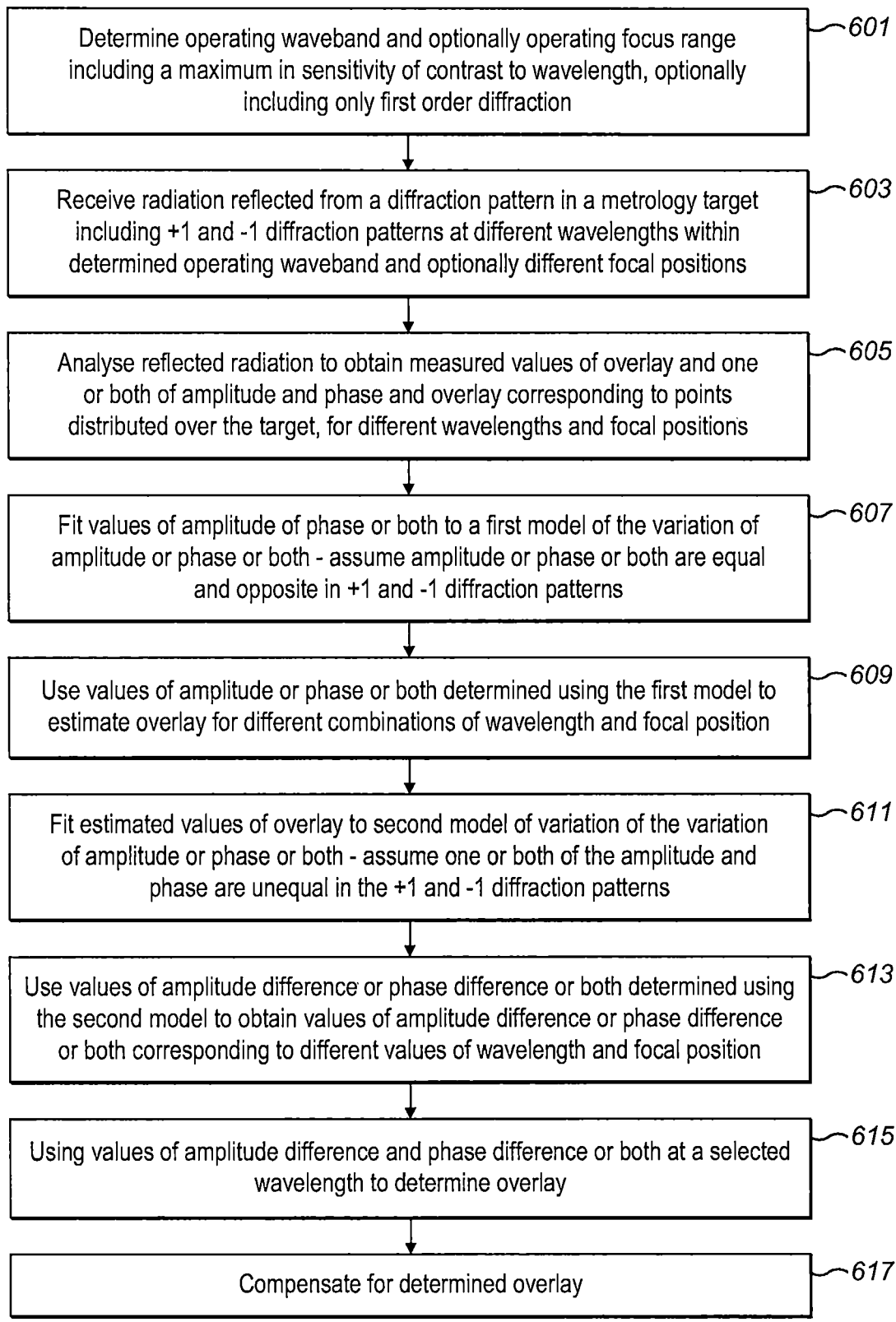
FIG. 6 is a flow chart showing a method according to some embodiments of the invention.

The flow in FIG. 6 proceeds to operation 603 where for example analysis unit 107 may receive radiation reflected from a diffraction grating in a metrology target including +1 and −1 diffraction patterns at different wavelengths within determined operating waveband and optionally different focal positions.

Next at operation 605 reflected radiation is analysed to obtain measured values of overlay and one or both of amplitude and phase corresponding to points distributed over the target, for different wavelengths and focal positions.

At operation 607 values of amplitude or phase or both are fitted to a first model of the variation of amplitude or phase or both—assume amplitude or phase or both are equal and opposite in +1 and −1 diffraction patterns.

At operation 609, values of amplitude or phase or both, determined using the first model, are used to estimate overlay for different combinations of wavelength and focal position.

At operation 611 estimated values of overlay obtained in operation 609 are fitted to a second model of variation of the variation of amplitude or phase or both. Here it is assumed that one or both of the amplitude and phase are unequal in the +1 and −1 diffraction patterns.

At operation 613 values of amplitude difference or phase difference or both, determined using the second model, are used to obtain values of amplitude difference or phase difference or both corresponding to different values of wavelength and focal position.

At operation 615 values of amplitude difference and phase difference or both at a selected wavelength are used to determine overlay.

Systems and methods according to some embodiments of the invention may output a determination of overlay, to be used for example in another tool or system or process.

Some systems and methods according to embodiments of the invention may include additional operations to compensate for the determined overlay, in ways known to those skilled in the art, indicated at operation 617. This may for example comprise checking whether the overlay is within predetermined tolerance limits, e.g. by comparison with an upper and/or lower threshold, and taking corrective action if the overlay is outside the limits. The compensation measures may include modifying the manufacturing process in order to reduce the OVL. Such measures are described in more detail in US 2014/0060148 A1.

An algorithm used in some methods and systems according to embodiments of the invention may overcome grating asymmetry caused by structural ambiguity. This method harnesses through focus and through wavelength information signals. Such signals can be provided for example, by the wave tuning technology of the Archer700 Imaging based overlay technology. A subset of data is learned from the signals can be understood as the phase and amplitude existing at the pupil plane of the imaging system. The grating, as in an Advance Imaging Metrology (AIM) target, works on the smallest pitch possible according to the illumination wavelength, minimizing target to device difference.

In some embodiments, a system may be enabled to operate according to the invention through different software, implemented for example in a processor in controller 110, using a currently available metrology system. Thus, some embodiments of the invention provide a computer readable medium, transitory or non-transitory, comprising instructions which when implemented in a processor of a semiconductor metrology system cause the system to operate according to any of the methods described herein.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

The invention claimed is:

1. A method of determining overlay in a semiconductor wafer manufacturing process comprising:
   receiving radiation reflected from a metrology target including +1 and 1 diffraction patterns at different wavelengths wherein the different wavelengths of radiation are in a waveband where a sensitivity of contrast to wavelength is at a maximum;
   analysing the radiation reflected from the metrology target to obtain measured values of overlay and one or both of amplitude and phase corresponding to points distributed over the metrology target, for different wavelengths;
   fitting the measured values of amplitude or phase or both to a first model of a variation of amplitude or phase or both, in which it is assumed that the amplitude or phase or both are equal and opposite in the +1 and 1 diffraction patterns;
   using values of amplitude or phase or both determined using the first model to obtain estimated values of overlay for different wavelengths;
   fitting the estimated values of overlay to a second model of a variation of the variation of amplitude or phase or both in which it is assumed that one or both of the amplitude and phase are unequal in the +1 and −1 diffraction patterns;
   using values of amplitude difference or phase difference or both determined using the second model to obtain values of amplitude difference or phase difference or both corresponding to different values of wavelength; and
   using values of amplitude difference or phase difference or both at a selected wavelength to determine an overlay.

2. The method as claimed in claim 1 wherein the radiation reflected from the metrology target is at different wavelengths and different focal positions, the measured values are obtained for different wavelengths and focal positions, the overlay is estimated for different wavelengths and different focal positions, and the values of amplitude difference and phase difference or both correspond to different values of wavelength and focal position.

3. The method as claimed in claim 1 wherein only radiation from first order diffraction patterns is present, or analysed.

4. The method as claimed in claim 1 wherein the values of amplitude difference or phase difference or both at the selected wavelength are used to determine the overlay as a weighted average of phase difference over illumination points on the target.

5. The method as claimed in claim 4 in which the phase difference is weighted by an average amplitude over the +1 and −1 diffraction orders.

6. The method as claimed in claim 1 in which the selected wavelength is a wavelength at which the sensitivity of contrast to wavelength is at a maximum.

7. The method as claimed in claim 1 comprising, prior to said receiving, determining one or both of an operating waveband and an operating focus range including a maximum in sensitivity of contrast to wavelength.

8. The method as claimed in claim 7 wherein the determining is restricted to first order diffraction.

9. A method of manufacturing a semiconductor wafer comprising determining overlay according to the method of claim 1 and compensating for the determined overlay.

10. A method for determining overlay in a semiconductor manufacturing process comprising:
    receiving radiation reflected from a metrology target including +1 and −1 diffraction patterns at different wavelengths in a waveband including a maximum of sensitivity of contrast to wavelength;
    analysing the radiation reflected from the metrology target to obtain measured values of overlay and one or both of amplitude and phase corresponding to points distributed over the metrology target, for different wavelengths; and
    performing a series of operations on the measured values of overlay to determine an overlay in which it is assumed that the amplitude and phase are unequal in the +1 and −1 diffraction orders.

11. The method as claimed in claim 10 in which the radiation reflected from the metrology target is additionally at different focal positions corresponding to different wavelengths, and said analyzing comprises obtaining measured values of overlay corresponding to different focal positions.

12. The method as claimed in claim 10 further comprising:
    a) fitting the measured values of amplitude or phase or both to a first model, in which it is assumed that the measured values of amplitude or phase or both are equal and opposite in the +1 and −1 diffraction patterns;

b) using values of amplitude or phase or both determined using the first model to estimate values of overlay for different wavelengths;

c) fitting the estimated values of overlay to a second model in which it is assumed that the measured values of one or both of the amplitude and phase are unequal in the +1 and −1 diffraction patterns;

d) using values of amplitude difference or phase difference or both determined using the second model to obtain values of amplitude difference or phase difference or both corresponding to different values of wavelength and focal position; and e) using values of amplitude difference or phase difference or both at a selected wavelength to determine the overlay.

13. The method as claimed in claim 10 further comprising:

a) fitting the measured values of amplitude and phase to a first model, in which it is assumed that the measured values of amplitude and phase are equal and opposite in the +1 and −1 diffraction patterns;

b) using values of amplitude and phase determined using the first model to estimate values of overlay for different wavelengths;

c) fitting the estimated values of overlay to a second model in which it is assumed that the amplitude and phase are unequal in the +1 and −1 diffraction patterns;

d) using values of amplitude difference and phase difference determined using the second model to obtain values of amplitude difference and phase difference corresponding to different values of wavelength and focal position; and e) using values of amplitude difference and phase difference at a selected wavelength to determine the overlay.

14. The method as claimed in claim 12 in which operation b) further comprises estimating overlay for different focal positions.

15. The method as claimed in claim 10 wherein determining overlay comprises fitting information on amplitude and/or phase from said points to a model relating the information to overlay, and updating the model based on measurements of overlay obtained by a different technique.

16. A system for determining overlay in a semiconductor manufacturing process, the system comprising:

an illumination system and an imaging system, the illumination system including a radiation source and the imaging system being arranged to direct radiation from the illumination system towards the surface of a target and to receive radiation from the illumination system reflected from the target in the form of diffraction patterns;

a control unit arranged to control the imaging system or the illumination system or both to obtain diffraction patterns using different values of focal position or wavelength or both; and an image analysis unit configured to:

receive radiation reflected from a metrology target including +1 and −1 diffraction patterns at different wavelengths in a waveband including a maximum of sensitivity of contrast to wavelength;

analyze the radiation reflected from the metrology target to obtain measured values of overlay and one or both of amplitude and phase corresponding to points distributed over the target, for different wavelengths; and perform a series of operations on the measured values of overlay to determine an overlay in which it is assumed that the amplitude and phase are unequal in the +1 and −1 diffraction orders.

17. The system as claimed in claim 16 wherein the imaging system comprises first and second cameras and the control unit is configured to vary the focal position of one camera with respect to the other.

* * * * *